(12) United States Patent
Chen et al.

(10) Patent No.: US 11,177,237 B2
(45) Date of Patent: Nov. 16, 2021

(54) MANUFACTURING METHOD OF SEMICONDUCTOR PACKAGE

(71) Applicant: Taiwan Semiconductor Manufacturing Co., Ltd., Hsinchu (TW)

(72) Inventors: Meng-Tse Chen, Pingtung County (TW); Ching-Hua Hsieh, Hsinchu (TW); Chung-Shi Liu, Hsinchu (TW); Chih-Wei Lin, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 48 days.

(21) Appl. No.: 16/714,823

(22) Filed: Dec. 16, 2019

(65) Prior Publication Data

US 2020/0118962 A1 Apr. 16, 2020

Related U.S. Application Data

(62) Division of application No. 15/491,986, filed on Apr. 20, 2017, now Pat. No. 10,510,709.

(51) Int. Cl.
*H01L 23/48* (2006.01)
*H01L 23/00* (2006.01)
(Continued)

(52) U.S. Cl.
CPC ............ *H01L 24/49* (2013.01); *H01L 21/561* (2013.01); *H01L 21/568* (2013.01); *H01L 21/6835* (2013.01); *H01L 24/02* (2013.01); *H01L 24/17* (2013.01); *H01L 21/566* (2013.01); *H01L 21/6836* (2013.01); *H01L 23/3128* (2013.01); *H01L 2221/68318* (2013.01); *H01L 2221/68331* (2013.01); *H01L 2221/68345* (2013.01); *H01L 2221/68359* (2013.01); *H01L 2221/68372* (2013.01); *H01L 2224/0231* (2013.01); *H01L 2224/0237* (2013.01); *H01L 2224/17104* (2013.01); *H01L 2224/18* (2013.01); *H01L 2924/01013* (2013.01); *H01L 2924/01029* (2013.01)

(58) Field of Classification Search
CPC ..... H01L 24/02; H01L 21/563; H01L 21/568; H01L 23/3135; H01L 2221/68359; H01L 2224/0231; H01L 2224/0237; H01L 2224/18
USPC .......................... 257/737, 787, 790
See application file for complete search history.

(56) References Cited

U.S. PATENT DOCUMENTS 6,043,109 A * 3/2000 Yang .................. H01L 23/3114
    438/109
6,649,445 B1 * 11/2003 Qi ........................ H01L 21/56
    257/E21.237

(Continued)

*Primary Examiner* — Nitin Parekh
(74) *Attorney, Agent, or Firm* — JCIPRNET

(57) ABSTRACT

A manufacturing method for semiconductor packages is provided. Chips are provided on a carrier. Through interlayer vias are formed over the carrier to surround the chips. A molding compound is formed over the carrier to partially and laterally encapsulate the chip and the through interlayer vias. The molding compound comprises pits on a top surface thereof. A polymeric molding compound is formed on the molding compound to fill the pits of the molding compound.

20 Claims, 13 Drawing Sheets

(51) Int. Cl.
*H01L 21/683* (2006.01)
*H01L 21/56* (2006.01)
*H01L 23/31* (2006.01)

(56) References Cited

U.S. PATENT DOCUMENTS

| | | | | |
|---|---|---|---|---|
| 8,158,888 | B2 * | 4/2012 | Shen | H05K 3/3452 |
| | | | | 174/260 |
| 8,779,606 | B2 * | 7/2014 | Yim | H01L 21/563 |
| | | | | 257/790 |
| 8,980,691 | B2 * | 3/2015 | Lin | H01L 23/5389 |
| | | | | 438/107 |
| 8,994,185 | B2 * | 3/2015 | Lin | H05K 1/185 |
| | | | | 257/774 |
| 9,000,584 | B2 | 4/2015 | Lin et al. | |
| 9,048,222 | B2 | 6/2015 | Hung et al. | |
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 2008/0006942 | A1 * | 1/2008 | Park | H01L 25/105 |
| | | | | 257/738 |
| 2011/0024899 | A1 * | 2/2011 | Masumoto | H01L 23/49827 |
| | | | | 257/737 |
| 2011/0278736 | A1 * | 11/2011 | Lin | H01L 23/49816 |
| | | | | 257/774 |
| 2015/0001563 | A1 * | 1/2015 | Miki | H01L 33/54 |
| | | | | 257/98 |

\* cited by examiner

MANUFACTURING METHOD OF SEMICONDUCTOR PACKAGE

CROSS-REFERENCE TO RELATED APPLICATION

This application is a divisional application of and claims the priority benefit of a prior application Ser. No. 15/491,986, filed on Apr. 20, 2017. The entirety of the above-mentioned patent application is hereby incorporated by reference herein and made a part of this specification.

BACKGROUND

Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
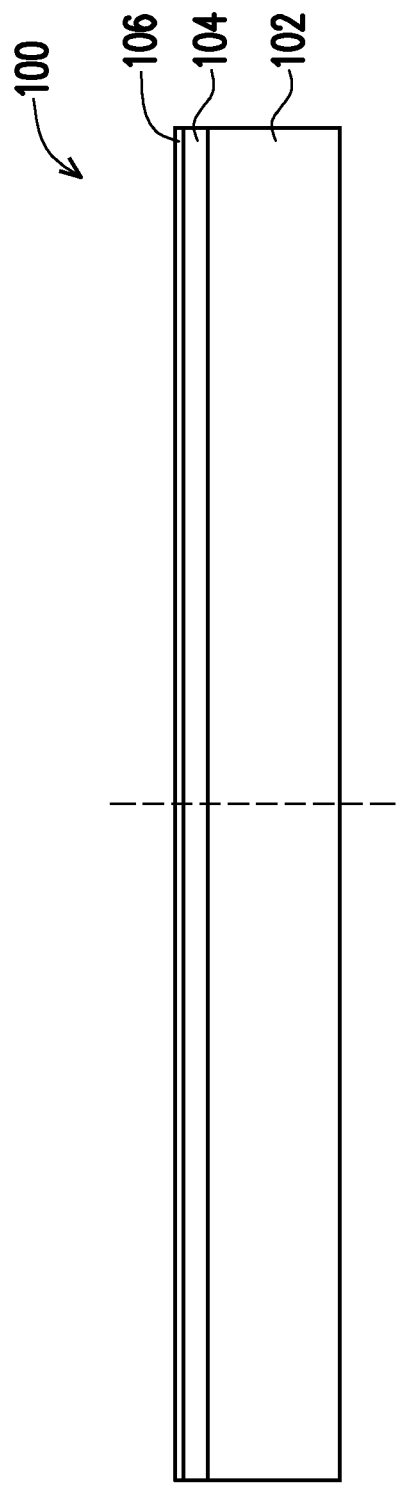
FIG. 1A to FIG. 1I are schematic cross sectional views of various stages in a manufacturing method of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 5:
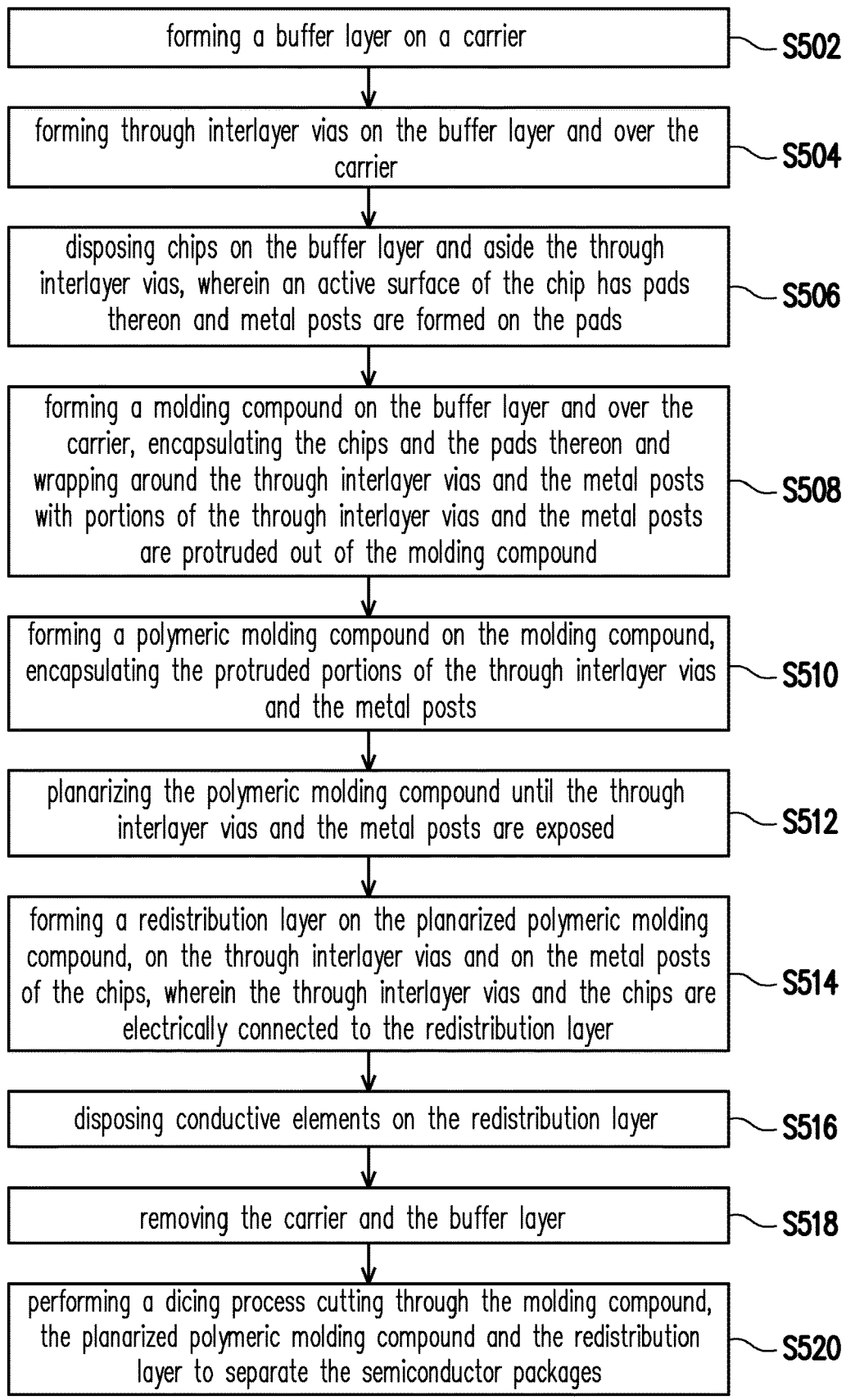
FIG. 5 is an exemplary flow chart showing the process steps of a manufacturing method of a semiconductor package according to some exemplary embodiments of the present disclosure.

FIG. 1A to FIG. 1I are schematic cross sectional views of various stages in a manufacturing method of a semiconductor package according to some exemplary embodiments. FIG. 5 is an exemplary flow chart showing the process steps of a manufacturing method of a semiconductor package according to some exemplary embodiments of the present disclosure. In exemplary embodiments, the semiconductor manufacturing method is part of a packaging process. In some embodiments, two chips or dies are shown to represent plural chips or dies of the wafer, and one or more packages 10 are shown to represent plural semiconductor packages obtained following the semiconductor manufacturing method.

Referring to FIG. 1A and in Step S502 of FIG. 5, in some embodiments, a carrier 102 with a buffer layer 104 coated thereon is provided, the carrier 102 may be a glass carrier or any suitable carrier for carrying a semiconductor wafer or a reconstituted wafer for the manufacturing method of the semiconductor package. In some embodiments, the buffer layer 104 includes a debond layer and the material of the debond layer may be any material suitable for bonding and debonding the carrier 102 from the above layers or wafer disposed thereon. In some embodiments, the buffer layer 104 includes, for example, a light-to-heat conversion ("LTHC") layer, and such layer enables room temperature debonding from the carrier by applying laser irradiation. Referring to FIG. 1A, in some embodiments, the buffer layer 104 includes a dielectric material layer made of a dielectric material including benzocyclobutene ("BCB"), polybenzoxazole ("PBO"), or any other suitable polymer-based dielectric material. In certain embodiments, a seed layer 106 is formed on the buffer layer 104. In some embodiments, the seed layer 106 includes one or more metal layers formed by sputtering or deposition.

Figure 1B:
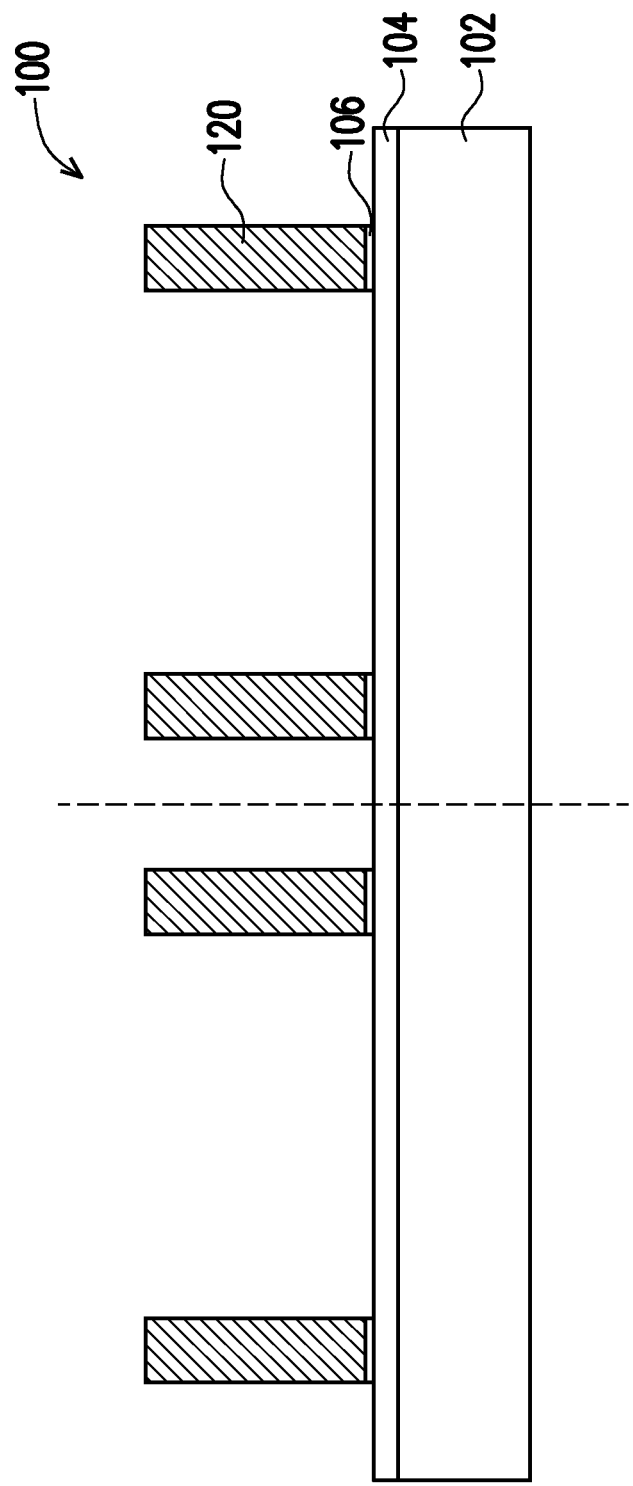

Referring to FIG. 1B and in Step S504 of FIG. 5, in some embodiments, through interlayer vias ("TIVs") 120 are formed on the buffer layer 104 over the carrier 102. In some embodiments, the TIVs 120 are through integrated fan-out ("InFO") vias. In some embodiments, the formation of the TIVs 120 includes forming a mask pattern (not shown) with openings on the seed layer 106 partially exposing the seed layer 106, then forming a metallic material (not shown) filling up the openings by electroplating or deposition, and removing the mask pattern to form the TIVs 120 on the seed layer 106. The seed layer 106 is partially removed or patterned using the TIVs 120 as the mask so that the seed layer 106 located between the TIVs 120 and the buffer layer 104 is remained. The material of the seed layer 106 varies depending on the material of the later-formed TIVs. In certain embodiments, the seed layer 106 (in FIG. 1A) is formed by firstly sputtering a composite layer of a titanium layer and a copper seed layer (not shown) over the buffer layer 104 on the carrier 102, while the TIVs 120 are subsequently formed by electroplating the metallic material (such as copper or a copper alloy) to fill the openings of the mask pattern. However, it is appreciated that the scope of this disclosure is not limited to the materials and descriptions disclosed above.

Figure 1C:
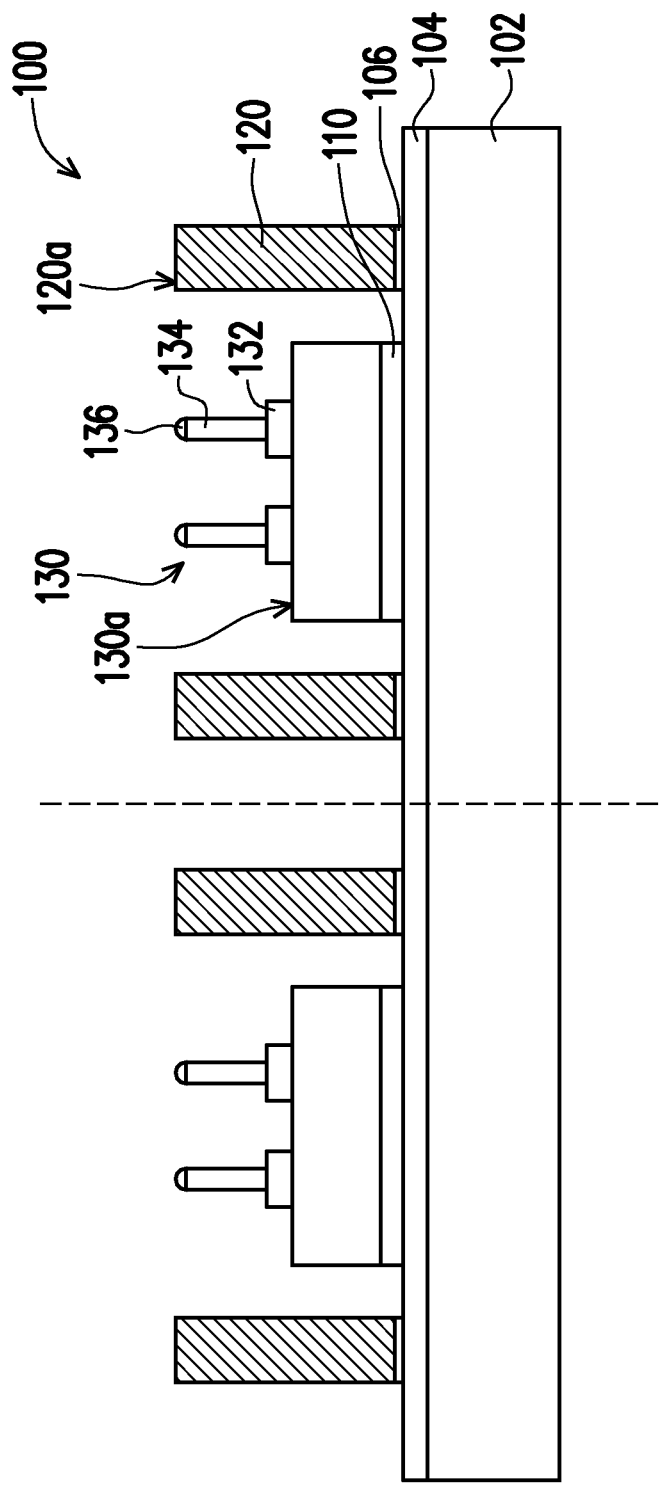

Referring to FIG. 1C and in Step S506 of FIG. 5, first chips 130 are provided and disposed on the exposed buffer layer 104 on the carrier 102. In exemplary embodiments, the first chips 130 may include the same types of chips or different types of chips or and may be digital chips, analog chips or mixed signal chips, such as application-specific integrated circuit ("ASIC") chips, sensor chips, wireless and radio frequency chips, memory chips, logic chips or voltage regulator chips. In some embodiments, the first chip 130 includes pads 132 on the active surface 130a and metal posts 134 located on the pads 132. In exemplary embodiments, the pads 132 are aluminum contact pads. In one embodiment, the metal posts 134 are copper posts or copper alloy posts having a height ranging from about 20 microns to about 25 microns measuring from the active surface 130a to its own top surface, for example. In certain embodiment, solders 136 may further be included and disposed on top of the metal posts 134. In certain embodiments, a die attach film 110 is disposed between the backside of the first chip 130 and the buffer layer 104 for better attachment, and the backsides of the first chips 130 are adhered to the carrier 102. In some embodiments, before placing the first chips 130 on the carrier 102, the metal posts 134 along with the solders 136 on the first chips 130 are uncovered (i.e. bare dies not molded or encapsulated) and the die attach film 110 is attached to the backside of the first chip 130. In some embodiments, the first chips 130 are placed over the carrier 102 and arranged aside the TIVs 120 (within the area surrounding by the TIVs). In some embodiments, as shown in FIG. 1C, the dotted line represents the cutting line of the whole package 100 in the subsequent cutting process and some of the TIVs 120 are arranged close to but not on the cutting line, and are arranged around the first chips 130.

Figure 1D:
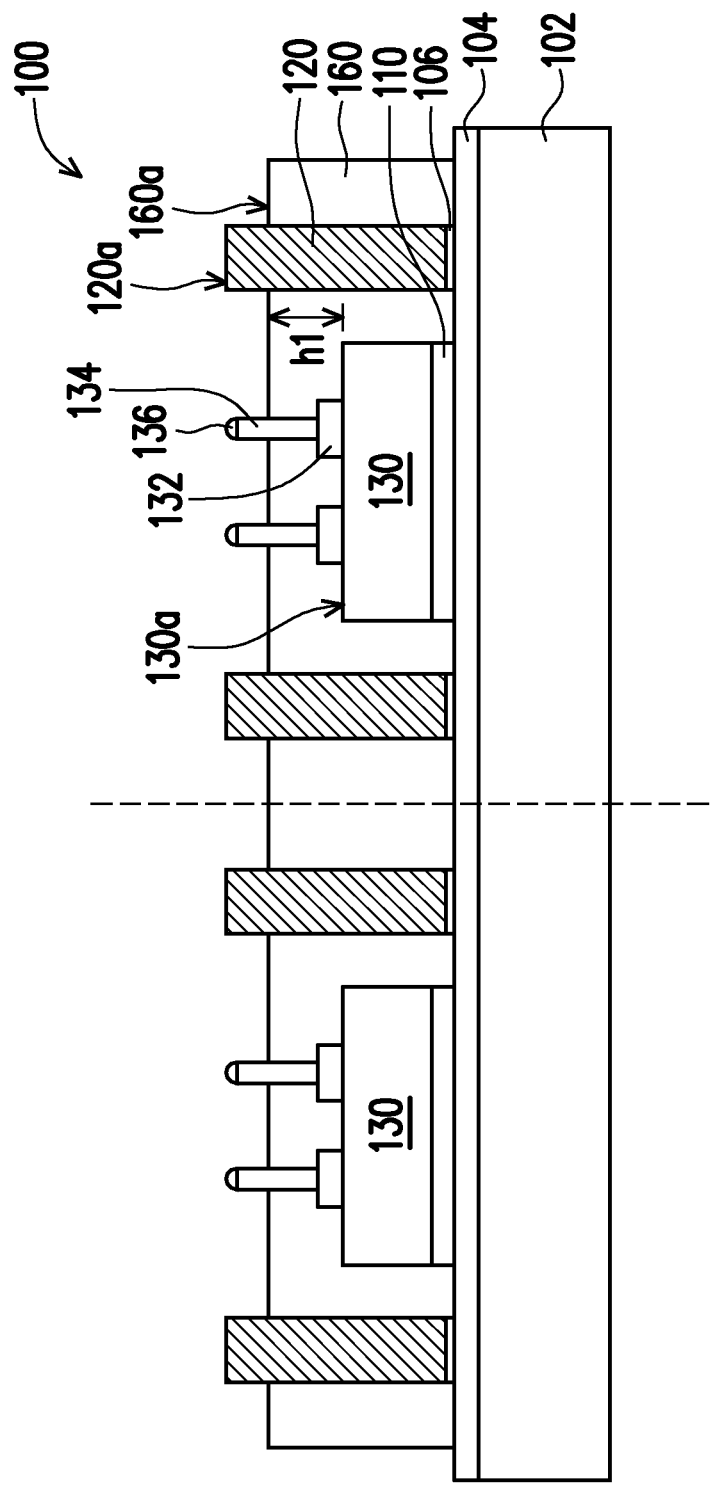

Referring to FIG. 1D and in Step S508 of FIG. 5, in some embodiments, a molding compound 160 is formed over the carrier 102 and the first chips 130 on the buffer layer 104 and the TIVs 120 located over the carrier 102 beside the first chips 130 are molded in the molding compound 160. In some embodiments, the molding compound 160 covers the buffer layer 104 and fills between the first chips 130 and the TIVs 120. In certain embodiments, the molding compound 160 that partially covers the TIVs 120 and the first chips is formed through the exposed TIV over molding technology. In exemplary embodiments, the exposed TIV over molding technology utilizes a mold chase with a release film coated on its inner surface to control the cured molded material covers the chips or components but exposes the TIVs. In some embodiments, the formed molding compound 160 covers the first chips 130 (covering the pads 132 but exposing portions of the metal posts 134 and exposing the solders 136) and covers the TIVs 120 partially with top portions of the TIVs 120 exposed. That is, the top surface 160a of the molding compound 160 is lower than the top surfaces 120a of the TIVs 120, lower than the solders 136 and lower than the tops of the metal posts 134 but higher than the active surface 130a of the first chip 130. In one embodiment, the height difference h1 (i.e., the distance in the thickness direction vertical to the active surface 130a) between the molding compound 160 and the first chip 130 (i.e. the height difference between the top surface 160a and the active surface 130a) ranges from about 15 microns to about 20 microns. As shown in FIG. 1D, the molding compound 160 does not cover the entirety of the TIVs 120 and the metal posts 134 as the solders 136, the tops of the metal posts 134 and the top portions of the TIVs 120 are exposed from the molding compound 160. That is, portions of the TIVs 120 and portions of the metal posts 134 (and solders 136) are protruded from the top surface 160a of the molding compound 160. In one embodiment, the material of the molding compound 160 includes at least one type of filler-containing resins and the resins may be epoxy resins, phenolic resins or silicon-containing resins. In exemplary embodiments, the fillers are made of non-melting inorganic materials and the fillers include metal oxide particles, silica particles or silicate particles. In some embodiments, the fillers are particles with the average particle size ranging from about 3 microns to about 20 microns, ranging from about 10 microns to about 20 microns or ranging from about 15 microns to about 20 microns. In one embodiment, the particle size of the fillers contained in the molding compound 160 is smaller than or at most equivalent to the height difference h1. In other words, the height difference h1 is larger than or at least equivalent to the particle size of the fillers contained in the molding compound 160 to better cover the active surface of the first chip(s). The surface roughness or surface flatness of the cured molding compound varies depending on fine or coarse filler particles added in the molding compound material. Better surface smoothness and flatness of the molding compound is achievable if fine filler particles are used. Alternatively, some pits may be formed in the surface(s) of the molding compound added with medium or coarse filler particles, resulting in larger surface roughness or even unevenness and possible connection failure.

Figure 1E:
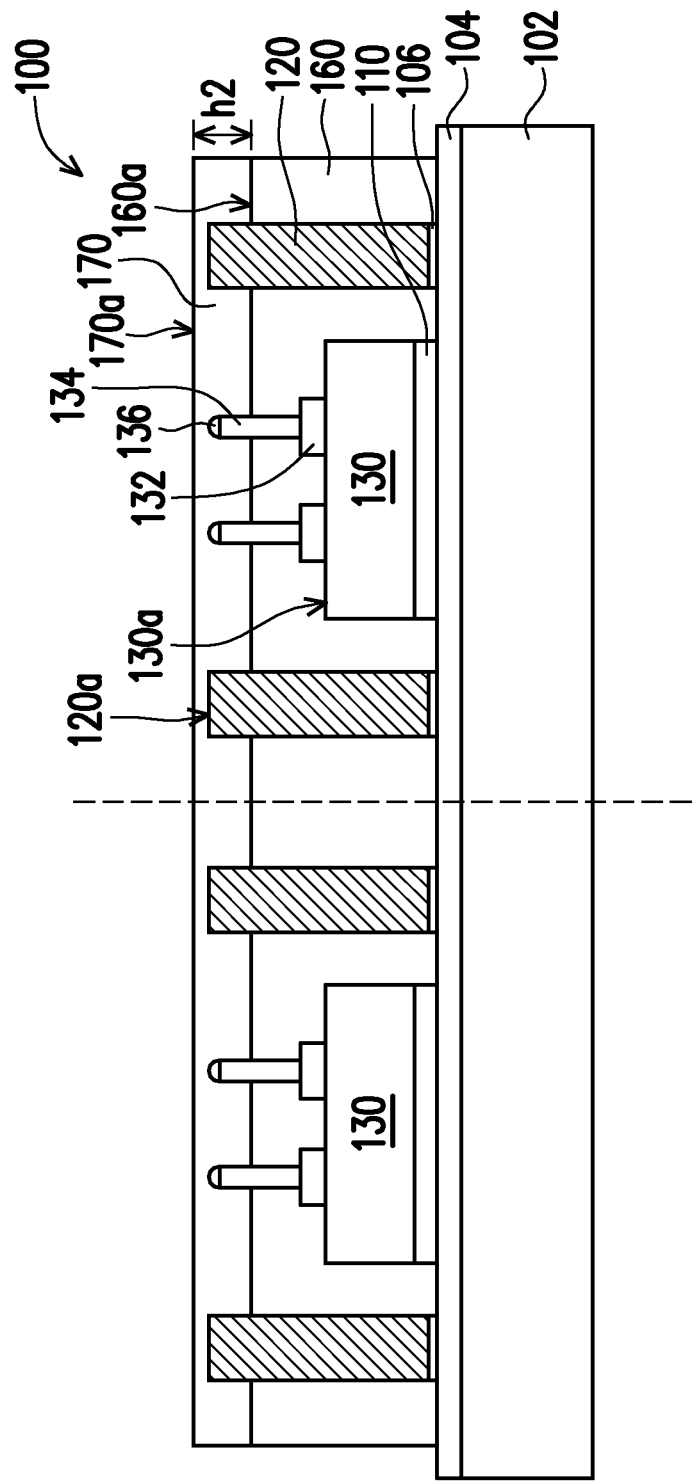

Referring to FIG. 1E and in Step S510 of FIG. 5, in some embodiments, a polymeric molding compound 170 is formed on the molding compound 160. As shown in FIG. 1E, the polymeric molding compound 170 is formed over the molding compound 160 covering the solders 136, the tops of the metal posts 134 and the top portions of the TIVs 120, which are exposed from the molding compound 160, so that the entirety of the TIVs 120, the first chips 130 and the metal posts 134 and solders 136 thereon is encapsulated by the molding compound 160 and the polymeric molding compound 170. In some embodiments, the protruded portions of the TIVs 120 and the metal posts 134 (and the solders 136) are encapsulated by the polymeric molding compound 170. In some embodiments, the thickness (or height h2) of the polymeric molding compound 170 (measuring from the top surface 160a of the molding compound 160 to the top surface 170a of the polymeric molding compound 170) ranges from about 10 microns to about 15 microns, for example. That is, the top surface 170a of the polymeric molding compound 170 is higher than the top surfaces 120a of the TIVs 120 and the solders 136 and higher than the tops of the metal posts 134 of the first chip 130. In alternative embodiments, the top surface 170a of the molding compound 170 may be substantially levelled with the top surfaces 120a of the TIVs 120 and the solders 136 and higher than the tops of the metal posts 134 of the first chip 130. In one embodiment, the height difference h2 between the top surface 170a of the polymeric molding compound 170 and the top surface 160a of the molding compound 160 ranges from about 10 microns to about 15 microns. In certain embodiments, the material of the polymeric molding compound 170 is different from the material of the molding compound 160. In exemplary embodiments, the material of the molding compound 170 includes a polymeric material free of fillers, and the polymeric material is selected from low-temperature curable polyimide (PI) materials, photosensitive or non-photosensitive dry film materials, epoxy resins, benzocyclobutene, polybenzooxazole, and any other suitable polymeric dielectric material. As the material of the polymeric molding compound 170 does not contain fillers and has better flow ability, the polymeric molding compound 170 can offer better coverage and filling capability over the underlying elements and molding compound 160, leading to better surface flatness and structural integrity and strength for the composite structure of the polymeric molding compounds 160, 170.

Figure 1F:
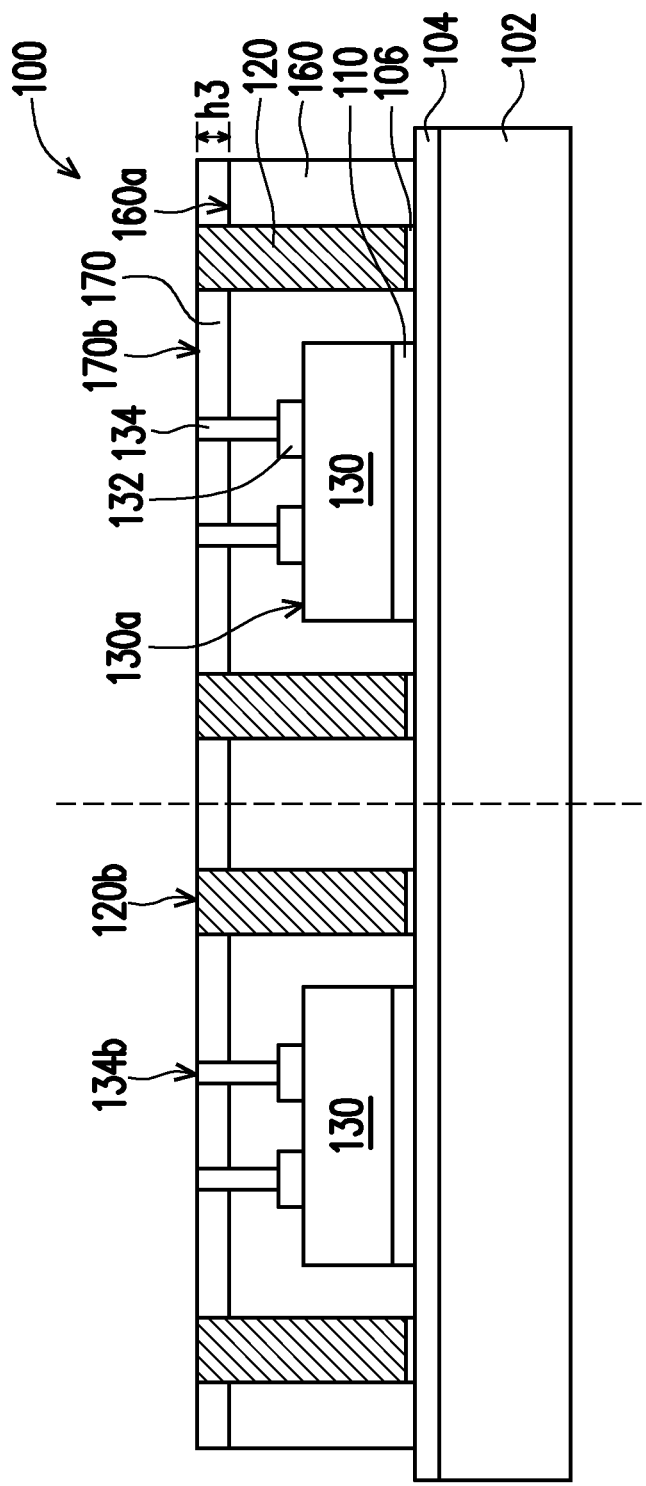

Referring to FIG. 1F and in Step S512 of FIG. 5, in some embodiments, a planarization process is performed to the composite structure of the molding compounds 160, 170, so that parts of the polymeric molding compound 170 and the TIVs 120 are removed together with the removal of the solders 136 until the metal posts 134 of the first chips 130 are exposed from the polymeric molding compound 170. In certain embodiments, after the planarization, the metal posts 134, the TIVs 120 and the polymeric molding compound 170 become flattened and substantially levelled (i.e. top surfaces 134b of the metal posts 134 and top surfaces 120b of the TIVs 120 are substantially coplanar and flush with the polished top surface 170b of the polymeric molding compound 170). In some embodiments, the planarization process for planarizing the polymeric molding compound 170 and the TIVs 120 includes a fly cut process, a grinding process or a chemical mechanical polishing ("CMP") process. In some embodiments, the thickness (or height h3) of the planarized polymeric molding compound 170 (measuring from the top surface 160a of the molding compound 160 to the planarized top surface 170b of the polymeric molding compound 170) ranges from about 5 microns to about 10 microns, for example. In exemplary embodiments, the ratio of h1/h3 ranges from about 1.5 to about 4. The metal posts 134 and the TIVs 120 are exposed from the top surface 170b of the planarized polymeric molding compound 170 for further connection. The polymeric molding compound 170 and the molding compound 160 constitute a composite molding compound. In alternative embodiments, the planarization process may be optional if the polymeric molding compound almost flushes with the tops of the metal posts and/or the TIVs.

Figure 2:
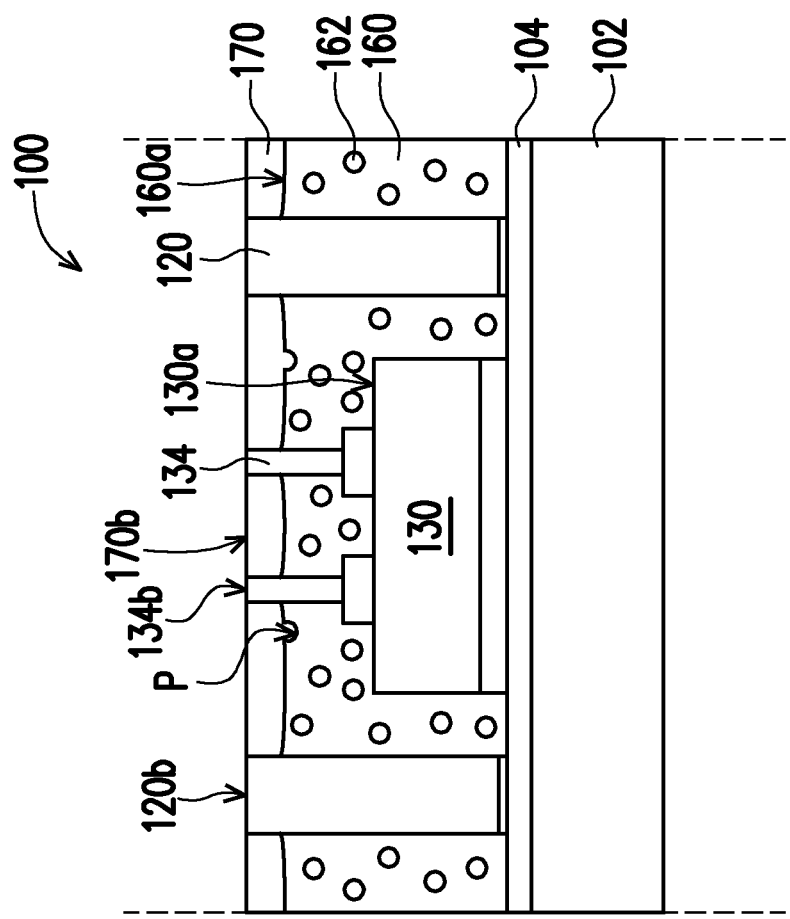
FIG. 2 is a schematic enlarged cross sectional view illustrating a semiconductor package according to some exemplary embodiments of the present disclosure.

FIG. 2 is a schematic enlarged cross sectional view illustrating a semiconductor package following the processes of FIGS. 1A-1F according to some exemplary embodiments of the present disclosure. Referring to FIG. 2, certain structural features including the interface between the molding compound 160 and the polymeric molding compound 170 are stressed for illustration purposes, and only one package 10 of the whole package structure 100 is shown for easy illustration. In exemplary embodiments, as shown in FIG. 2, the package 10 includes at least one first chip 130 and TIVs 120 arranged aside of the first chip 130, and the first chip includes pads 132 formed on the active surface 130a of the first chip 130 and metal posts 134 disposed on the pads 132. In some embodiments, the first chip 130 (together with the pads 132 and the metal posts 134 of the first chip 130) and the TIVs 120 are encapsulated within the molding compound 160 and the polymeric molding compound 170. In some embodiments, the molding compound 160 at least covers the first chip 130 and the pads 132 thereon and partially covers and wraps around the TIVs 120. In some embodiments, the top surface 160a of the molding compound 160 is higher than the active surface 130a of the first chip 130 but lower than the top surfaces 120b of the TIVs 120. That is, portions of the metal posts 134 and portions of the TIVs 120 are exposed from the molding compound 160 but are encapsulated in the polymeric molding compound 170. In certain embodiments, some pits P may be formed in the top surface 160a of the molding compound 160 added with fillers 162 (e.g. medium or coarse filler particles), and the polymeric molding compound 170 without fillers is formed to cover the molding compound 160, encapsulate the metal posts 134 and TIVs 120 and fill the pits P. In some embodiments, the size of the pits P at the interface 160a between the molding compound 160 and the polymeric molding compound 170 is slightly smaller or about the size of the fillers 162. Referring to FIG. 2, as the polymeric molding compound 170 does not contain fillers, the polished or planarized polymeric molding compound 170 has little or even no pits generated thereon following the planarization process and has satisfactory surface smoothness and flatness. In certain embodiments, the planarized top surface 170b of the polymeric molding compound 170 has a surface roughness of merely about 3 microns or even less than 3 microns. As shown in FIG. 1F and FIG. 2, the composite structure of molding compound 160 and the polymeric molding compound 170 provides better planarization and enhanced protection for the chips and TIVs encapsulated therein.

Figure 1G:
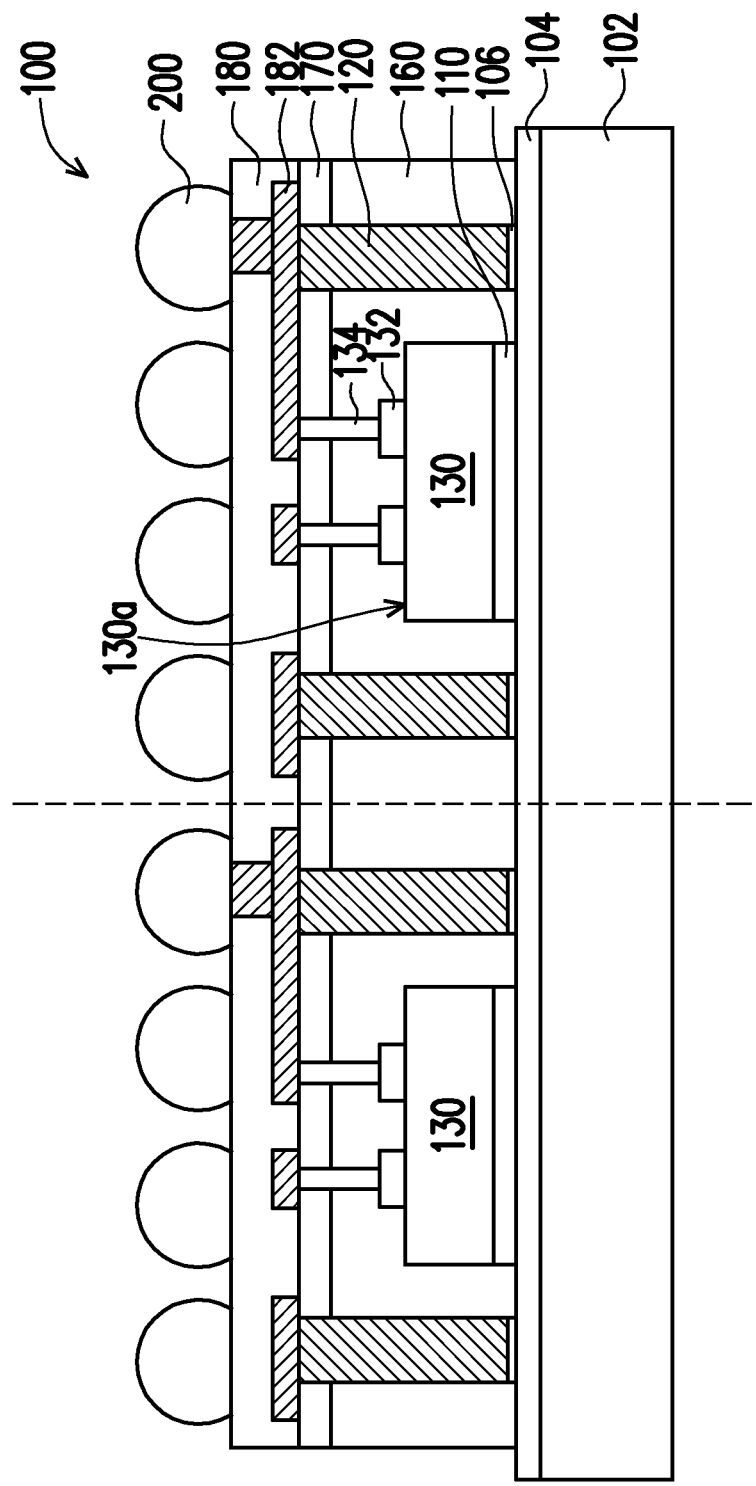

Referring to FIG. 1G and in Step S514 of FIG. 5, in some embodiments, a redistribution layer 180 is formed on the polymeric molding compound 170, over the metal posts 134 of the first chips 130 and on the TIVs 120. In some embodiment, the redistribution layer 180 is electrically connected to the TIVs 120 and the metal posts 134 of the first chips 130. The formation of the redistribution layer 180 includes sequentially forming one or more dielectric material layers and one or more metallization layers in alternation. In certain embodiments, the metallization layer(s) may be sandwiched between the dielectric material layer(s), but at least the bottom metallization layer 182 of the redistribution layer 180 is physically connected to the metal posts 134 of the first chips 130 and the TIVs 120. In some embodiments, the material of the metallization layer(s) includes aluminum, titanium, copper, nickel, tungsten, silver and/or alloys thereof. In some embodiments, the material of the dielectric material layer(s) includes polyimide, benzocyclobutene, or polybenzooxazole. In some embodiments, the redistribution layer 180 is a front-side redistribution layer electrically connected to the first chips 130 and is electrically connected to the TIVs 120. In certain embodiments, as the underlying molding compounds 160, 170 provides better planarization and evenness, the later-formed redistribution layer 180, especially the metallization layer with thin line width or tight spacing, can be formed with uniform line-widths or even profiles over the flat and level polymeric molding compound 170, resulting in improved line/wiring reliability.

Referring to FIG. 1G and in Step S516 of FIG. 5, in some embodiments, the conductive elements 200 are disposed on the redistribution layer 180 and are electrically connected to the redistribution layer 180. In some embodiments, prior to disposing the conductive elements 200, flux may be applied so that the conductive elements 200 are better fixed to a top metallization layer (not shown) of the redistribution layer, and the top metallization layer may function as contact pads for the conductive elements 200. In some embodiments, the conductive elements 200 are, for example, solder balls or ball grid array ("BGA") balls placed on the redistribution layer 180 and the top metallization layer underlying the conductive elements 200 functions as ball pads. In some embodiments, some of the conductive elements 200 are electrically connected to the first chips 130 through the redistribution layer 180, and some of the conductive elements 200 are electrically connected to the TIVs 120.

Figure 1H:
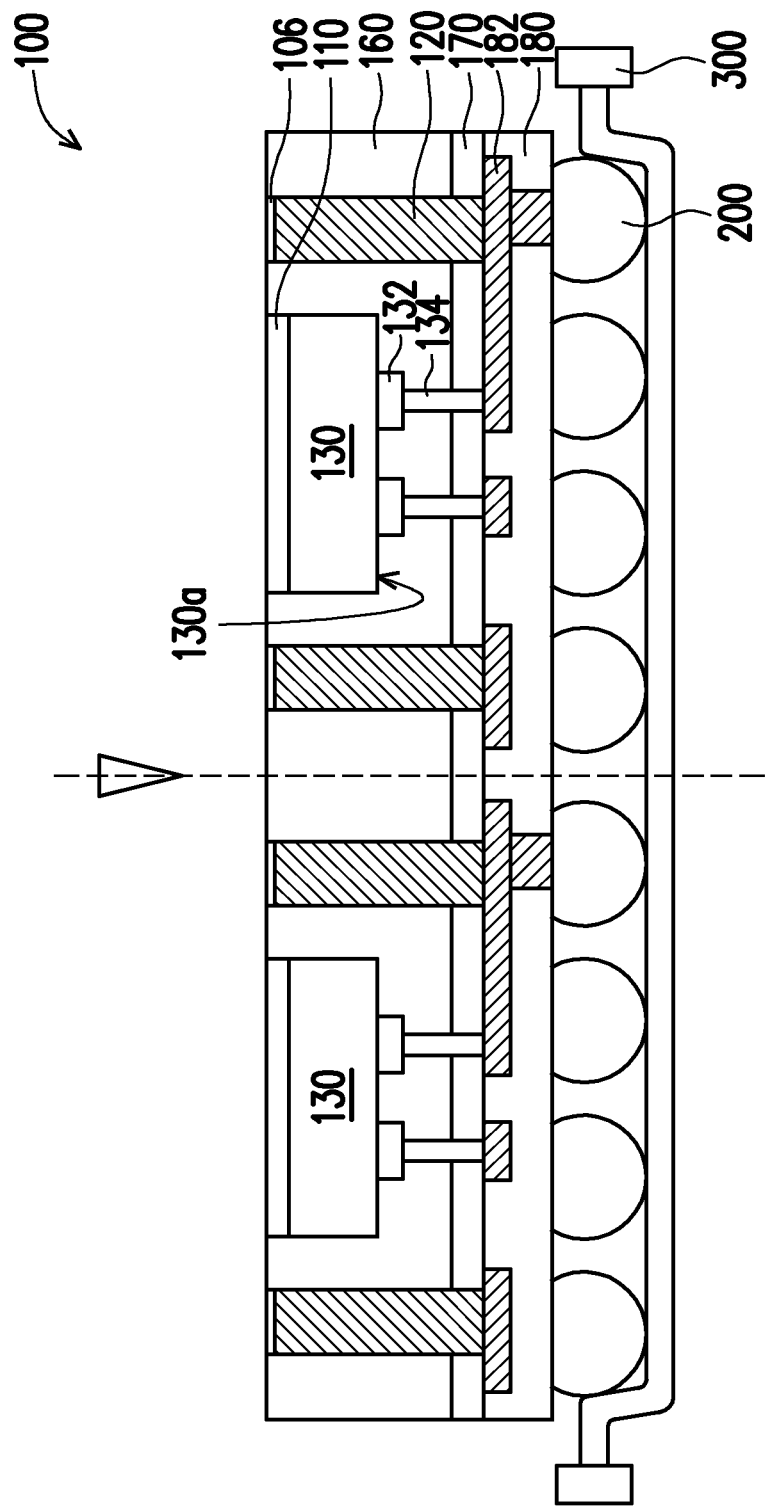

In Step S518 of FIG. 5 and referring to FIGS. 1G & 1H, in some embodiments, the whole package 100 is debonded from the carrier 102 to separate the first chips 130 from the carrier 102. In some embodiments, after debonding from the carrier 102, the buffer layer 104 remained on the whole package 100 is removed through an etching process or a cleaning process. Optionally, in later processes, another redistribution layer (not shown) will be formed at the backside of the chip 130 and over the other surface 160b of the molding compound 160. Alternatively, in one embodiment, the buffer layer 104 may be remained.

Figure 1I:
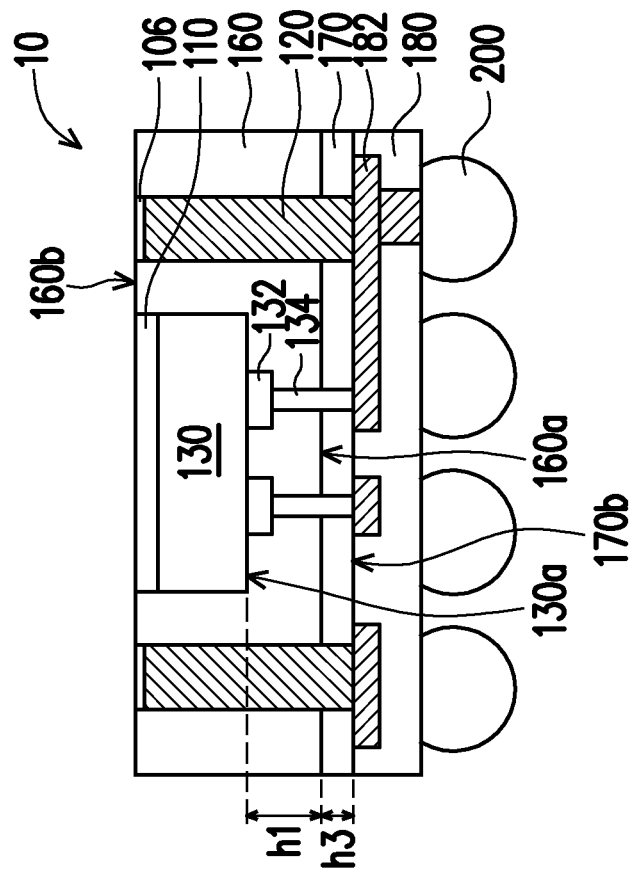

Referring to FIG. 1H, in some embodiments, the whole package 100 is turned upside down and disposed on a carrier film 300. Subsequently, in certain embodiments, a dicing process is performed to cut the whole package structure (at least cutting though the molding compound 160, the polymeric molding compound 170, and the redistribution layer 180) along the cutting line (the dotted line) into individual and separated semiconductor packages 10, as shown in FIG. 1I and in Step S520 of FIG. 5. In one embodiment, the dicing process is a wafer dicing process including mechanical blade sawing or laser cutting.

Referring to FIG. 1I, as the package structure is turned upside down, the top surfaces may become the bottom surfaces and the relative positional relationships (such as above, below, higher or lower) may become the opposite for the package structures as described above, but the same surfaces, common surfaces or interfaces will be marked with the same reference numbers for the individual semiconductor package(s) 10.

In exemplary embodiments, the manufacturing method(s) described above is part of the packaging processes, and a plurality of semiconductor packages 10 is obtained after the wafer dicing process. During the packaging processes, the semiconductor package structure 10 may be further mounted with additional packages, chips/dies or other electronic devices.

Figure 3:
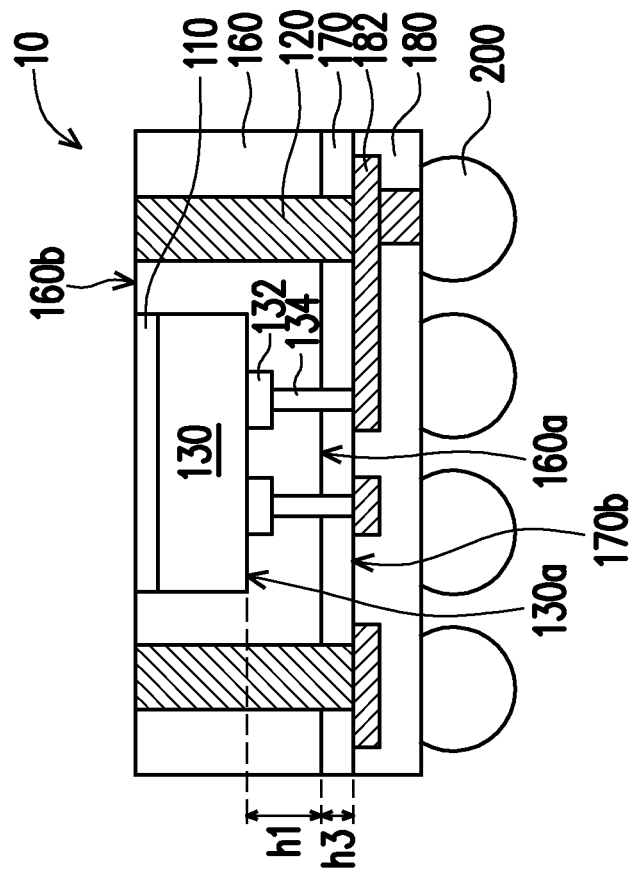
FIG. 3 is a schematic cross sectional view illustrating a semiconductor packages according to some exemplary embodiments of the present disclosure.

FIG. 3 is a schematic cross sectional view illustrating a semiconductor package according to some exemplary embodiments. In FIG. 3, a semiconductor package 10 similar to the structure as shown in FIG. 1I is described, except the seed layer 106 is omitted. Referring to FIG. 3, in exemplary embodiments, the semiconductor package 10 comprises a redistribution layer 180, a polymeric molding compound 170 disposed on the redistribution layer and through interlayer vias (TIVs) 120 disposed on the redistribution layer 180 and penetrating through the polymeric molding compound 170. In some embodiments, conductive elements 200 are disposed on the redistribution layer 180 and the conductive elements 200 are electrically connected to the redistribution layer 180. Also, in some embodiments, a molding compound 160 is disposed on the polymeric molding compound 170 and at least one chip 130 is encapsulated within the molding compound 160. The chip 130 is disposed above the redistribution layer 180 and the polymeric molding compound 170. In some embodiments, an active surface 130a of the chip 130 has pads 132 thereon and metal posts 134 connected to the pads 132 are disposed on and underneath the pads 132. In some embodiments, the TIVs 120 are arranged aside and surrounding the chip 130, and the redistribution layer 180 is physically and electrically connected with the TIVs 120 and the metal posts 134 of the chip 130. In some embodiments, the molding compound 160 encapsulates the pads 132 and the chip 130 and wraps around the TIVs 120 and the metal posts 134. In some embodiments, as shown in FIG. 3, portions of the TIVs 120 and the metal posts 134 are protruded out of the molding compound 160, and the protruded portions of the TIVs 120 and the metal posts 134 are encapsulated by the polymeric molding compound 170. In some embodiments, the TIVs 120 penetrating through the molding compound 160 and the polymeric molding compound 170 are in physical contact with the metallization layer 182 of the redistribution layer 180. In some embodiments, a material of the polymeric molding compound is different from a material of the molding compound. In some embodiments, the molding compound 160 includes fillers and the polymeric molding compound 170 contains no fillers. In some embodiments, the material of the molding compound 160 includes at least one type of filler-containing resins and the resins may be epoxy resins, phenolic resins or silicon-containing resins. In exemplary embodiment, the fillers are made of non-melting inorganic materials and the fillers include metal oxide particles, silica particles or silicate particles with the average particle size ranging from about 3 microns to about 20 microns, from about 10 microns to about 20 microns or ranging from about 15 microns to about 20 microns. In exemplary embodiments, the material of the molding compound 170 includes a polymeric material free of fillers and the polymeric material is selected from low-temperature curable polyimide (PI) materials, photosensitive or non-photosensitive dry film materials, epoxy resins, benzocyclobutene, polybenzooxazole, and any other suitable polymeric dielectric material.

Referring to FIG. 3, in some embodiments, the height difference h1 between an active surface 130a of the chip 130 and the interface 160a between the molding compound 160 and the polymeric molding compound 170 is larger than the height difference h3 between the interface 160a between the molding compound 160 and the polymeric molding compound 170 and the interface 170b between the polymeric molding compound 170 and the redistribution layer 180. In some embodiments, the height difference h1 is about 1.5 times to about 4 times of the height difference h3. In some embodiments, the height difference h1 is larger than or at least equivalent to the particle size of the fillers contained in the molding compound 160 so that the molding compound 160 fully covers the active surface 130a of the chip 130.

Figure 4:
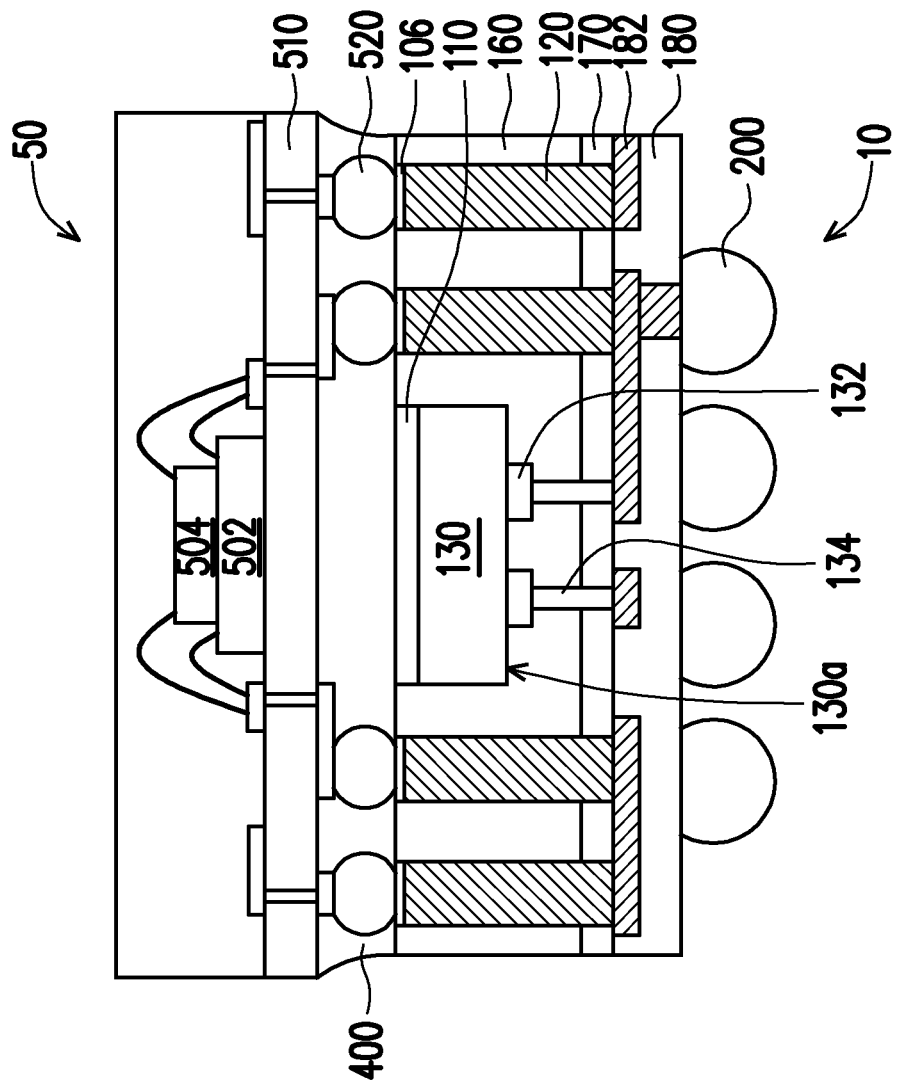
FIG. 4 is a schematic cross sectional view illustrating a semiconductor packages according to some exemplary embodiments of the present disclosure.

In FIG. 4, in exemplary embodiments, a semiconductor package 10 is provided, and the semiconductor package 10 is similar to the package 10 as seen in FIG. 1I and may be fabricated following the previously described manufacturing process as described in FIG. 1A-1H. The elements similar to or substantially the same as the elements described above will use the same reference numbers, and certain details or descriptions of the same elements will not be repeated herein. Referring to FIG. 4, in some embodiments, at least one semiconductor sub-package 50 is provided and disposed on the semiconductor package 10. In exemplary embodiments, the sub-package 50 includes a second chip 502, a third chip 504 stacked thereon, at least one redistribution layer 510 electrically connected with the second and third chips 502, 504 and connectors 520 disposed on the redistribution layer 510. In some embodiments, the semiconductor sub-package 50 is connected with the semiconductor package 10 through the connectors 520. In some embodiments, at least one of the chips 502, 504 is electrically connected with the first chip 130 and/or the conductive elements 200 through the redistribution layer 510, connectors 520, TIVs 120 and the redistribution layer 180. In some embodiments, an underfill material 400 is filled between the semiconductor sub-packages 50 and the semiconductor package 10.

The formation of the molding compound and the polymeric molding compound covering the molding compound provides flexibility in material choices and larger process window for the molding compound and improved reliability for the redistribution layer having fine line/space. Corresponding to particle sizes of the fillers contained in the material of the molding compound, the polymeric molding compound without containing fillers can cover possibly generated pits on the molding compound to provide a better planarized surface, beneficial for the later formed metal lines or wirings thereon, especially for metal lines with fine line/space.

According to some embodiments, a semiconductor package has at least one chip, a polymeric molding compound, a molding compound, and through interlayer vias. The through interlayer vias are disposed within and penetrate through the molding compound. The at least one chip is disposed within the molding compound. The through interlayer vias are arranged aside and surrounding the at least one chip. The at least one chip has metal posts disposed thereon. The molding compound encapsulates the at least one chip and wraps around the through interlayer vias and the metal posts of the at least one chip, and portions of the metal posts and the through interlayer vias are protruded out of the molding compound. The polymeric molding compound is disposed on the molding compound, and the polymeric molding compound encapsulates the protruded portions of the metal posts and the through interlayer vias. A material of the polymeric molding compound is different from a material of the molding compound.

According to some embodiments, a semiconductor package has a chip, through interlayer vias and a composite molding compound. The composite molding compound comprises a polymeric molding compound and a molding compound disposed on the polymeric molding compound. The through interlayer vias are disposed within the composite molding compound and penetrate through the composite molding compound. The chip is disposed within the molding compound, encapsulated by the molding compound and surrounded by the through interlayer vias. An active surface of the chip has metal posts disposed thereon. Portions of the through interlayer vias and the metal posts are wrapped by the molding compound and other portions of the through interlayer vias and the metal posts are wrapped by the polymeric molding compound. The molding compound contains fillers and the polymeric molding compound contains no fillers.

According to some embodiments, a manufacturing method for semiconductor packages is provided. Chips are provided on a carrier. Through interlayer vias are formed over the carrier to surround the chips. A molding compound is formed over the carrier to partially and laterally encapsulate the chip and the through interlayer vias. The molding compound comprises pits on a top surface thereof. A polymeric molding compound is formed on the molding compound to fill the pits of the molding compound.

According to some embodiments, a manufacturing method for semiconductor packages is provided. Through interlayer vias are formed on a carrier. Chips are disposed on the carrier and aside the through interlayer vias. An active surface of the chip has metal posts formed thereon. A molding compound is formed over the carrier, encapsulating the chips and wrapping around portions of the through interlayer vias and the metal posts, leaving portions of the through interlayer vias and the metal posts protruded out of the molding compound. A polymeric molding compound is formed on the molding compound, encapsulating the protruded portions of the through interlayer vias and the metal posts. The molding compound includes concave portions and the polymeric molding compound includes protrusions fitted into the concave portions. The polymeric molding compound is planarized until the through interlayer vias and the metal posts are exposed. A dicing process is performed cutting through the molding compound and the planarized polymeric molding compound to separate the semiconductor packages.

According to some embodiments, a manufacturing method for semiconductor packages is provided. Through interlayer vias are formed on a carrier. Chips are disposed on the carrier and are aside the through interlayer vias. An active surface of the chip has metal post formed thereon. A composite molding compound is formed over the carrier to encapsulate the chips and the through interlayer vias. A dicing process cutting through the composite molding compound is performed to separate the semiconductor packages. The composite molding compound is formed by at least the following steps. A molding compound is formed to encapsulate a first portion of each through interlayer via and a first portion of each metal post. The molding compound includes concave portions on a top surface thereof. A polymeric molding compound is formed on the molding compound to encapsulate a second portion of each through interlayer via and a second portion of each metal post. The polymeric molding compound includes protrusions fitted into the concave portions. The polymeric molding compound is planarized until the through interlayer vias and the metal posts are exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A manufacturing method for a semiconductor package, comprising:

providing chips on a carrier, wherein each of the chips has an active surface and a rear surface opposite to the active surface, and the rear surface faces the carrier;
forming through interlayer vias over the carrier to surround the chips;
forming a molding compound over the carrier to partially and laterally encapsulate the chips and the through interlayer vias, wherein the molding compound comprises pits on a top surface thereof; and
forming a polymeric molding compound on the molding compound to fill the pits of the molding compound.

2. The method as claimed in claim 1, wherein forming the polymeric molding compound on the molding compound further comprises encapsulating the chips and the through interlayer vias exposed by the molding compound.

3. The method as claimed in claim 2, further comprising:
planarizing the polymeric molding compound until the through interlayer vias are exposed;
forming a redistribution layer on the planarized polymeric molding compound and the through interlayer vias, wherein the redistribution layer is electrically connected to the through interlayer vias;
disposing conductive elements on the redistribution layer; and
performing a dicing process cutting through the molding compound and the planarized polymeric molding compound to separate the semiconductor packages.

4. The method as claimed in claim 3, wherein planarizing the polymeric molding compound comprises performing a fly cut process, a grinding process or a chemical mechanical polishing process.

5. The method as claimed in claim 1, wherein forming the molding compound with a first material with fillers and forming the polymeric molding compound with a second material without fillers, and the first material with fillers is different from the second material without fillers.

6. The method as claimed in claim 1, further comprising forming a seed layer between the through interlayer vias and the carrier.

7. The method as claimed in claim 1, wherein the pits are spaced apart from the through interlayer vias.

8. A manufacturing method for semiconductor packages, comprising:
forming through interlayer vias on a carrier;
disposing chips on the carrier and aside the through interlayer vias, wherein an active surface of the chip has metal posts formed thereon;
forming a molding compound over the carrier, encapsulating the chips and wrapping around portions of the through interlayer vias and the metal posts, leaving portions of the through interlayer vias and the metal posts protruded out of the molding compound;
forming a polymeric molding compound on the molding compound, encapsulating the protruded portions of the through interlayer vias and the metal posts, wherein the molding compound comprises concave portions and the polymeric molding compound comprises protrusions fitted into the concave portions;
planarizing the polymeric molding compound until the through interlayer vias and the metal posts are exposed; and
performing a dicing process cutting through the molding compound and the planarized polymeric molding compound to separate the semiconductor packages.

9. The method as claimed in claim 8, further comprising forming a redistribution layer on the planarized polymeric molding compound, on the through interlayer vias and on the metal posts of the chips and disposing conductive elements on the redistribution layer.

10. The method as claimed in claim 8, further comprising forming solders on the metal posts before forming the molding compound.

11. The method as claimed in claim 10, wherein the solders on the metal posts are encapsulated during forming the polymeric molding compound.

12. The method as claimed in claim 10, wherein planarizing the polymeric molding compound comprises removing the solders to expose the metal posts.

13. The method as claimed in claim 8, wherein planarizing the polymeric molding compound comprises performing a fly cut process, a grinding process or a chemical mechanical polishing process.

14. The method as claimed in claim 8, wherein forming the molding compound with a first material with fillers and forming the polymeric molding compound with a second material without fillers, and the first material with fillers is different from the second material without fillers.

15. A manufacturing method for semiconductor packages, comprising:
forming through interlayer vias on a carrier;
disposing chips on the carrier and aside the through interlayer vias, wherein an active surface of the chip has metal posts formed thereon;
forming a composite molding compound over the carrier to encapsulate the chips and the through interlayer vias, comprising:
forming a molding compound to encapsulate a first portion of each through interlayer via and a first portion of each metal post, wherein the molding compound comprises concave portions on a top surface thereof;
forming a polymeric molding compound on the molding compound to encapsulate a second portion of each through interlayer via and a second portion of each metal post, wherein the polymeric molding compound comprises protrusions fitted into the concave portions; and
planarizing the polymeric molding compound until the through interlayer vias and the metal posts are exposed; and
performing a dicing process cutting through the composite molding compound to separate the semiconductor packages.

16. The method as claimed in claim 15, further comprising:
forming a redistribution layer on the composite molding compound, the through interlayer vias, and the metal posts of the chips, wherein the redistribution layer is electrically connected to the through interlayer vias and the metal posts; and
disposing conductive elements on the redistribution layer.

17. The method as claimed in claim 15, further comprising forming solders on the metal posts before forming the composite molding compound.

18. The method as claimed in claim 17, wherein the solders on the metal posts are encapsulated during forming the polymeric molding compound.

19. The method as claimed in claim 17, wherein planarizing the polymeric molding compound comprises removing the solders to expose the metal posts.

20. The method as claimed in claim 15, wherein planarizing the polymeric molding compound comprises performing a fly cut process, a grinding process or a chemical mechanical polishing process.

* * * * *